United States Patent
Jon et al.

(10) Patent No.: US 7,709,319 B2
(45) Date of Patent: May 4, 2010

(54) SEMICONDUCTOR DEVICE AND METHOD OF MANUFACTURING THE SAME

(75) Inventors: Yeol Jon, Yongin-si (KR); Chung-Ki Min, Yongin-si (KR); Yong-Sun Ko, Suwon-si (KR); Kyung-Hyun Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/450,269

(22) Filed: Jun. 12, 2006

(65) Prior Publication Data

US 2007/0063247 A1 Mar. 22, 2007

(30) Foreign Application Priority Data

Jun. 13, 2005 (KR) .................. 10-2005-0050272

(51) Int. Cl.
*H01L 27/108* (2006.01)
(52) U.S. Cl. ............... 438/241; 257/E21.648; 257/E21.66; 438/239; 438/253; 438/396
(58) Field of Classification Search ......... 438/239–256, 438/386–399; 257/E21.648, E21.66
See application file for complete search history.

(56) References Cited

U.S. PATENT DOCUMENTS

| | | | | |
|---|---|---|---|---|
| 5,386,382 A | * | 1/1995 | Ahn | 365/174 |
| 6,143,596 A | * | 11/2000 | Wang | 438/238 |
| 6,171,902 B1 | | 1/2001 | Ida | |
| 6,177,695 B1 | * | 1/2001 | Jeng | 257/296 |
| 6,215,144 B1 | * | 4/2001 | Saito et al. | 257/310 |
| 6,700,153 B2 | | 3/2004 | Oh et al. | |
| 6,716,756 B2 | * | 4/2004 | Kang | 438/692 |
| 6,730,563 B2 | * | 5/2004 | Matsumura | 438/255 |
| 6,893,914 B2 | * | 5/2005 | Kim et al. | 438/241 |
| 7,071,071 B2 | * | 7/2006 | Iijima et al. | 438/396 |
| 2003/0232483 A1 | * | 12/2003 | Fujiishi | 438/396 |
| 2004/0051127 A1 | * | 3/2004 | Tanaka | 257/296 |
| 2006/0011964 A1 | * | 1/2006 | Satou | 257/306 |
| 2006/0063324 A1 | * | 3/2006 | Park et al. | 438/239 |
| 2007/0037334 A1 | * | 2/2007 | Muemmler et al. | 438/197 |
| 2007/0045693 A1 | * | 3/2007 | Manning et al. | 257/296 |
| 2009/0256182 A1 | * | 10/2009 | Sukekawa | 257/296 |

FOREIGN PATENT DOCUMENTS

| | | |
|---|---|---|
| JP | 11-026718 | 1/1999 |
| KR | 10-2004-0022043 | 3/2004 |
| KR | 10-2004-0105929 | 12/2004 |

* cited by examiner

*Primary Examiner*—Kiesha R Bryant
*Assistant Examiner*—Eric Ward
(74) *Attorney, Agent, or Firm*—Harness, Dickey & Pierce, P.L.C.

(57) ABSTRACT

Provided is a semiconductor device including a vertically oriented capacitor extending above the substrate surface and a method of manufacturing such devices in which cell, peripheral and boundary areas between the cell and peripheral areas are defined on a semiconductor substrate. Capacitors are formed in the cell area, a mold pattern is provided in the peripheral areas and an elongated dummy pattern is provided in the boundary areas. The dummy pattern includes a boundary opening in which a thin layer is formed on the elongated inner sidewalls and on the exposed portion of the substrate during formation of the lower electrode. A mold pattern and lower electrode structures having substantially the same height are then formed area so that subsequent insulation interlayer(s) exhibit a generally planar surface, i.e., have no significant step difference between the cell areas and the peripheral areas.

17 Claims, 13 Drawing Sheets

SEMICONDUCTOR DEVICE AND METHOD OF MANUFACTURING THE SAME

PRIORITY STATEMENT

This application claims priority under 35 U.S.C. §119 from Korean Patent Application No. 2005-50272, which was filed on Jun. 13, 2005, the disclosure of which is herein incorporated by reference in its entirety.

BACKGROUND OF THE INVENTION

1. Field of the Invention

The invention relates to semiconductor devices, and more particularly, to semiconductor devices comprising a higher density cell area having a plurality of capacitors including, for example, projecting lower electrodes, adjacent a lower density peripheral region and methods of manufacturing the same.

2. Description of the Related Art

Due to the technical requirements associated with achieving higher degrees of integration in semiconductor devices, there has been continuing emphasis on reducing the surface area required for forming a memory cell in semiconductor memory devices. These efforts have led to difficulties in forming capacitors having a sufficient storage capacitance within the memory cell. Various methods have been proposed and/or adopted for maintaining the capacitance of such storage capacitors at acceptable levels in a reduced cell area. One approach involves increasing the height of the storage node by, for example, increasing the height of the lower electrode of a capacitor to form what is widely referred to as a cylindrical capacitor.

Examples of such cylindrical capacitor structures are disclosed in U.S. Pat. Nos. 6,700,153 and 6,171,902, the disclosures of which are hereby incorporated, in their entirety, by reference.

FIG. 1 is a cross sectional view illustrating a semiconductor device that includes a cylindrical capacitor. FIGS. 2A and 2B are cross sectional views illustrating various processing steps according to a method of forming the cylindrical capacitor as shown in FIG. 1. As illustrated in FIG. 1, the semiconductor device includes a capacitor 22 formed on a substrate 10 that includes a cell area in which the memory cells are formed and a peripheral area in which other associated circuitry will be formed. Although not shown, those of skill in the art will appreciate that the semiconductor device also includes a number of other underlying structures including, for example, wells, isolation regions, gate patterns and bit lines, formed on the substrate 10.

A first insulation interlayer 12 is formed on the substrate 10, and a contact pad 14 is formed through the first insulation interlayer 12 in the cell area of the substrate 10. The capacitor 22 includes a cylindrical lower electrode 16, a dielectric layer 18 formed on the cylindrical lower electrode 16 and an upper electrode 20 formed on the dielectric layer 18. The contact pad 14 is electrically connected to a lower electrode of the capacitor 22, and a second insulation interlayer 24 is formed on the capacitor 22.

The cylindrical capacitor 22 is formed in the cell area of the substrate 10, and a mold pattern 26 in the peripheral area of the substrate 10 is removed simultaneously when the mold pattern 26 in the cell area and the sacrificial layer 28 are removed after a node separation of the lower electrodes as shown in FIGS. 2A and 2B. As a result, as illustrated in FIG. 1, the second insulation interlayer 24 exhibits a large step difference between the cell area and the peripheral area of the substrate.

This step difference results when the second insulation interlayer 24 in the peripheral area of the substrate 10 is formed directly on the first insulation interlayer 12 while the second insulation interlayer 24 in the cell area of the substrate 10 is formed on the upper electrode 20 of the capacitor 22, thereby producing a step difference corresponding to the relative height difference between the surface in the cell area and the surface in the peripheral area of the substrate 10. Accordingly, the step difference exhibited by the second insulation interlayer 24 corresponds to the height of the capacitor 22.

However, this large step difference in the second insulation interlayer 24 increases the likelihood of various processing and/or patterning defects during the manufacture of semiconductor devices that include a cylindrical capacitor. An additional process, for example, a chemical mechanical polishing (CMP) process, may been utilized for reducing or removing the step difference from the surface of the second insulation interlayer 24. However, the inclusion of one or more additional process steps requires additional time and increases the cost of manufacturing such semiconductor devices.

Accordingly, a need remains for an improved method of reducing or removing the step difference from the surface of an insulation interlayer formed on a semiconductor substrate that includes a cell area having cylindrical capacitors and an adjacent peripheral region.

SUMMARY OF THE INVENTION

Example embodiments of the invention include semiconductor devices in which little or no step difference is produced in an insulation interlayer that is formed on a cell area having cylindrical capacitors and an adjacent peripheral area.

Example embodiments of the invention also include methods of manufacturing the semiconductor devices exhibiting little or no step difference in an insulation interlayer that is formed on both a cell area having cylindrical capacitors and an adjacent peripheral area without an additional process.

Example embodiments of the invention include semiconductor devices that include a mold pattern having a height that is substantially the same as a cylindrical lower electrode. Example embodiments of semiconductor devices according to the invention exhibit little or no step difference in an insulation interlayer provided on a semiconductor substrate on which a cell area, a peripheral area and a boundary area between the cell area and the peripheral area are defined with capacitor provided in the cell area of the substrate wherein the capacitors include a cylindrical lower electrode, a dielectric layer on the lower electrode and an upper electrode on the dielectric layer. A mold pattern is provided in the peripheral area of the substrate to a height corresponding to the cylindrical lower electrodes in the cell area. A dummy pattern is formed in the boundary area of the substrate with the dummy pattern including a boundary opening through which the substrate is exposed and in which a thin layer of material is provided on an inner sidewall of the boundary opening and on the substrate exposed through the boundary opening. The thin layer comprises a material substantially the same as the lower electrode.

Example embodiments of the invention also include methods of manufacturing the semiconductor devices including forming a mold layer on the substrate on which a cell area, a peripheral area and a boundary area between the cell area and the peripheral area are defined, etching the mold layer to form a first mold pattern having mold openings through which portions of the substrate are exposed in the cell area, a boundary opening through which other portions of the substrate are exposed in the boundary area and a residual mold layer remaining in the peripheral area, forming a thin layer on inner sidewalls of the cylindrical hole, on an upper surface of the first mold pattern, on an inner sidewall of the boundary opening, on an upper surface of the residual mold layer and on the exposed substrate, forming a sacrificial layer on the resultant structure, removing upper portions of the thin layer and the sacrificial layer to expose an upper surface of the first mold pattern and an upper surface of the residual mold layer, thereby achieving a node separation, forming a hard mask pattern on the residual mold layer, using the hard mask pattern and the remaining portions of the thin layer as an etching mask to remove exposed portions of the sacrificial layer and the first mold pattern to form a cylindrical lower electrode in the cell area, a dummy pattern in the boundary area and a second mold pattern including the residual mold layer in the peripheral area, forming, in sequence, a dielectric layer and an upper electrode on the resultant structure including the lower electrode and the second mold pattern.

In some example embodiments of the invention, the sacrificial layer comprises an oxide, and a wet etching process may be performed using an aqueous Low Ammonium fluoride Liquid (LAL) solution that includes ammonium fluoride ($NH_4F$), hydrogen fluoride (HF) and water ($H_2O$) or another suitable etchant, for example, a conventional Buffered Oxide Etch (BOE), after the node separation, so that the sacrificial layer and the first mold pattern are simultaneously removed from the substrate.

In some example embodiments of the invention, the sacrificial layer comprises photoresist composition. In such cases, a photoresist film is formed on top surfaces of the residual mold layer and the thin and sacrificial layers after the node separation, and the photoresist film and the sacrificial layer in the cell area are simultaneously removed by a photolithography process, for example, through application of a developing solution, thereby forming a hard mask pattern on the on the residual mold layer. The first mold pattern may then be etched away using a Low Ammonium fluoride Liquid (LAL) including ammonium fluoride ($NH_4F$), hydrogen fluoride (HF) and water ($H_2O$) or other suitable etchant composition.

According to still other example embodiments of the invention, there are provided methods of manufacturing semiconductor devices in which a mold layer is formed on a substrate on which a cell area, a peripheral area and a boundary area between the cell area and the peripheral area have been defined. Regions of the mold layer are then removed from the substrate to form a first mold pattern in the cell area that includes a hole, typically cylindrical, through which a portion of the substrate is exposed in the cell area. Other regions of the mold layer are removed to form a boundary opening through other regions of the substrate are exposed. The boundary openings may be oriented with respect to cell area and may exhibit an elongated structure with a residual region of the mold layer remaining in the peripheral area. A thin layer is formed on inner sidewalls of the cylindrical hole, on top surface of the first mold pattern, on an inner sidewall of the boundary opening, on a top surface of the residual mold layer and on the exposed substrate. A sacrificial layer is formed on a resultant structure, after which upper portions of the sacrificial layer and the thin layer are removed to expose upper surfaces of both the first mold pattern and the residual mold layer. With the upper portions removed, the residual portions of the thin layer and the sacrificial layer will remain only in the cylindrical holes and the boundary openings, thereby completing a node separation. The sacrificial layer is then removed from the cylindrical hole and the boundary opening after which a hard mask pattern is formed on the residual mold layer as an etching mask. The first mold pattern is etched away using the hard mask pattern and the remaining portions of the thin layer as an etching mask, thereby forming a cylindrical lower electrode in the cell area, a dummy pattern including the thin layer remaining on an inner sidewall and a bottom portion of the boundary opening in the boundary area and a second mold pattern including the residual mold layer in the peripheral area. A dielectric layer and an upper electrode are then sequentially formed on a resultant structure including the lower electrode and the second mold pattern.

According to the example embodiments of the invention, a boundary area is defined between the cell area and the peripheral area on the substrate and an etching mask is formed on the residual mold layer in the peripheral area. As a result, the residual mold layer is not removed during the processing to remove those portions of the mold layer found in the cell area (i.e., the mold pattern) and the boundary area after node separation. The methods according to the example embodiments of the invention produce semiconductor device structures in which a mold pattern is provided in the peripheral region of the semiconductor device, the mold pattern having a height that is substantially the same as the height of the lower electrodes formed in the cell area of the substrate. As a result, an insulation interlayer subsequently formed on a semiconductor substrate in which the initial surfaces of the peripheral region(s) and the cell region(s) are substantially coplanar, will exhibit little or no step difference between adjacent cell areas and peripheral areas.

BRIEF DESCRIPTION OF THE DRAWINGS

The invention will become more apparent by consideration of the written description below in which example embodiments are detailed with reference to the attached drawings in which.

Figure 1:
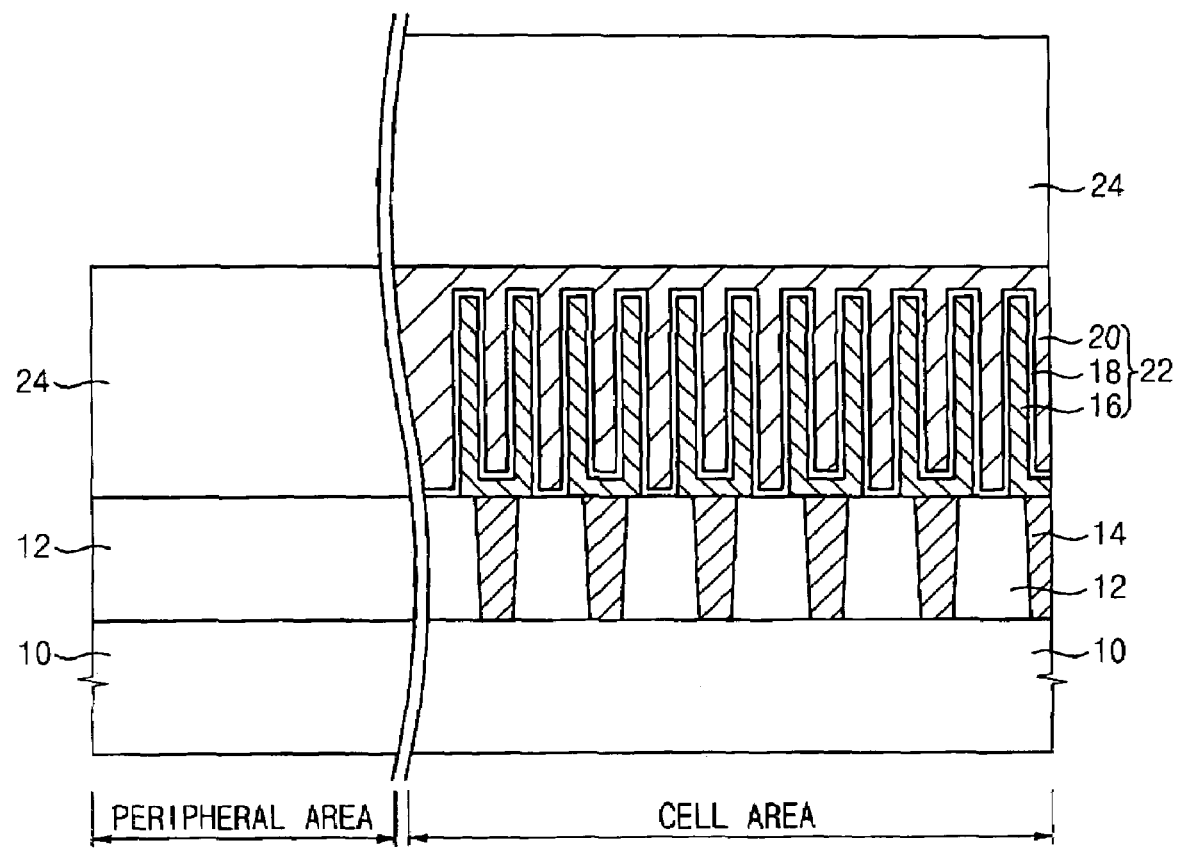
FIG. 1 is a cross sectional view illustrating a conventional semiconductor device including a cylindrical capacitor.
Figure 2A:
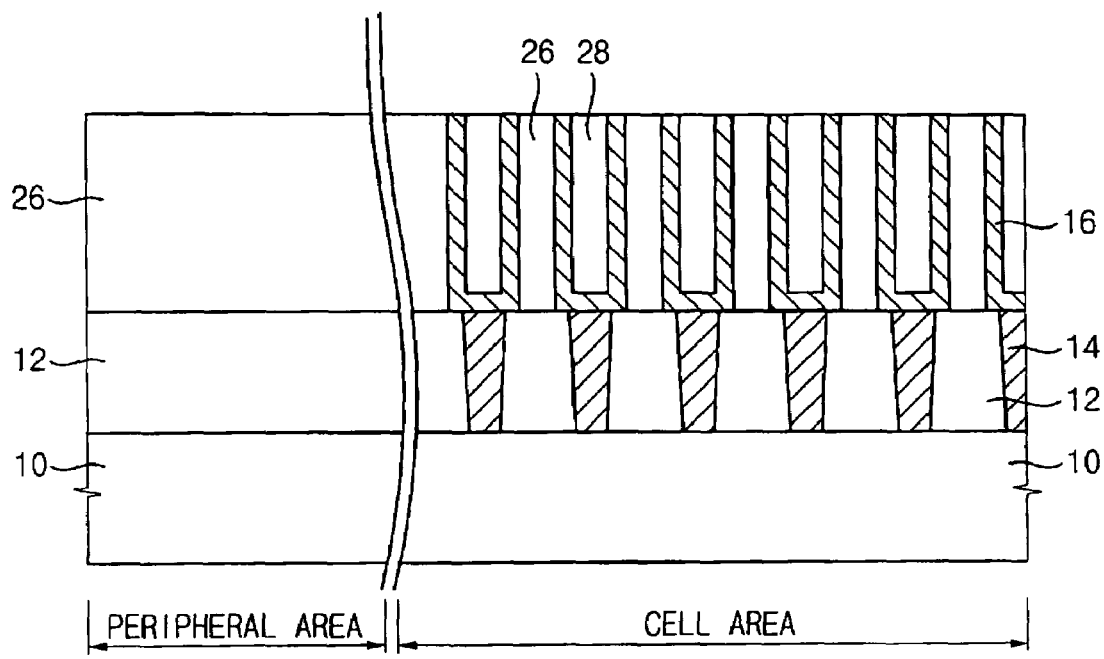
FIGS. 2A and 2B are cross sectional views illustrating processing steps for a conventional method of forming the cylindrical capacitor shown in FIG. 1.
Figure 2B:
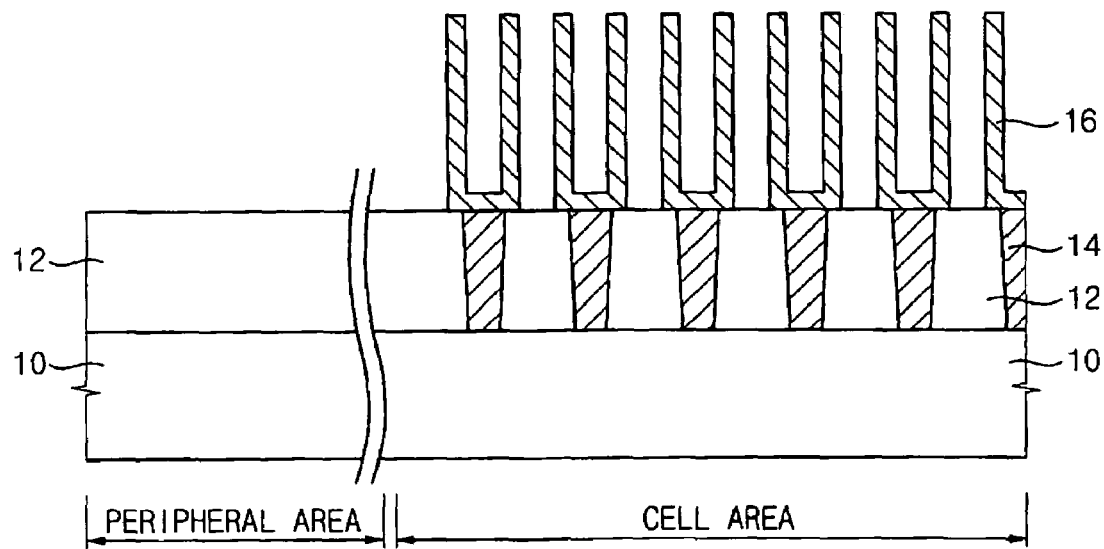

These drawings are provided for illustrative purposes only and are not drawn to scale. The spatial relationships and relative sizing of the elements illustrated in the various embodiments, for example, the various films comprising the memory device and/or gate structures, may have been reduced, expanded or rearranged to improve the clarity of the figure with respect to the corresponding description. The figures, therefore, should not be interpreted as accurately reflecting the relative sizing, value or positioning of the corresponding structural elements that could be encompassed by actual semiconductor devices manufactured according to the example embodiments of the invention.

DESCRIPTION OF EXAMPLE EMBODIMENTS

The invention is described more fully hereinafter with reference to the accompanying drawings, in which example embodiments of the invention are shown. As will be appreciated by those skilled in the art, however, this invention may be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Throughout the description and the corresponding drawings, identical or similar reference numerals are used to indicate identical or corresponding elements and/or structures. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, for example, "beneath", "below", "lower", "above", "upper" and the like, may be used herein for ease of description to describe one element or feature's relationship to other element(s) or feature(s) as illustrated in the figures, typically with the original substrate being considered the "lowest" or "bottom" structural element above which the remainder of the device is arrayed. Similarly, it will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle win, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein are intended have the same meaning as commonly understood by one of ordinary skill in the art to which this invention belongs. It will be further understood that terms, for example, those defined in commonly used dictionaries, should be interpreted as having a meaning that is consistent with their meaning in the context of the relevant art and the full specification and are not be interpreted in a general, idealized or overly formal sense unless expressly so defined herein.

Figure 3:
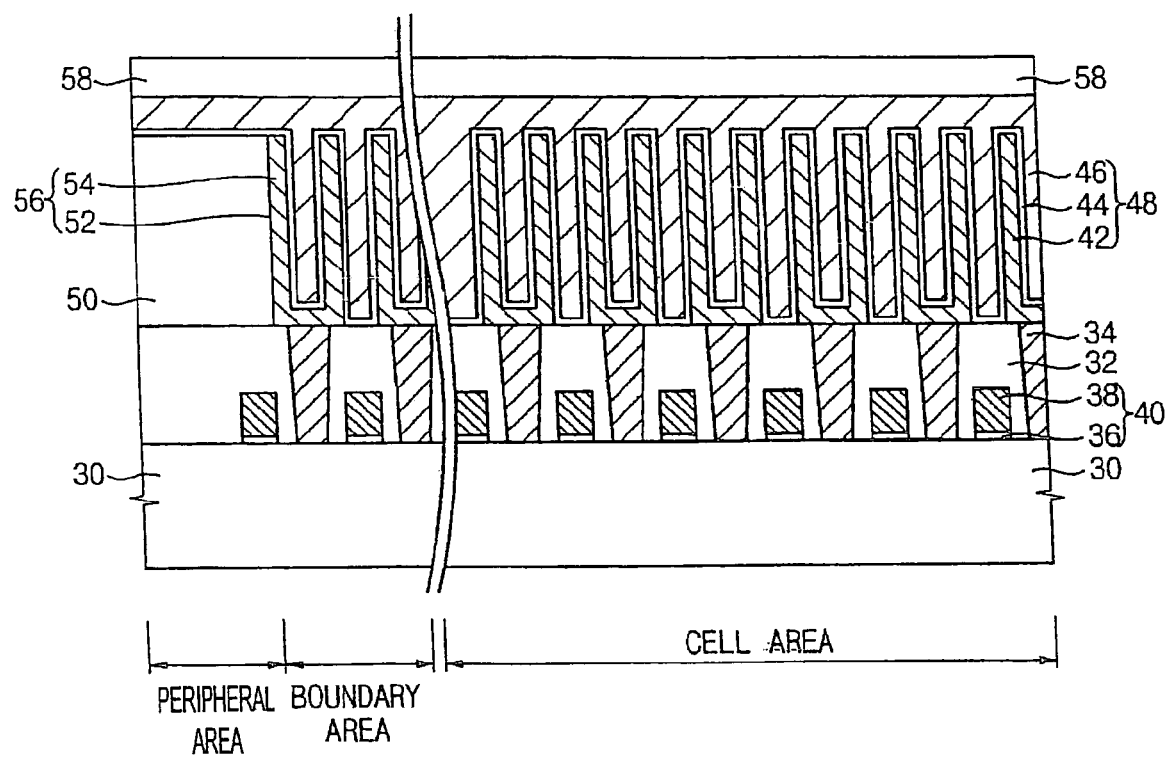
FIG. 3 is a cross sectional view illustrating a semiconductor device including a cylindrical capacitor according to an example embodiment of the invention.

FIG. 3 is a cross sectional view illustrating a semiconductor device including a cylindrical capacitor according to an example embodiment of the invention. As illustrated in FIG. 3, a semiconductor device according to an example embodiment of the invention includes a memory device formed on a semiconductor substrate 30 having a cell area, a peripheral area and a boundary area separating the cell area and the peripheral area. The semiconductor device includes various gate patterns 40 and capacitors 48 formed on the cell area of the substrate 30, a mold pattern 50 formed on the peripheral area of the substrate 30 and a dummy pattern 56 formed on the boundary area of the substrate 30. Although not shown in figures, the semiconductor device further includes bit lines formed over the capacitors 48.

In most instances, an isolation pattern (not shown) is formed in the substrate 30 to define active regions on which conductive structures are formed and field regions for electrically isolating adjacent active regions from one another. Hereinafter, the isolation layer for defining the active regions and the field regions is referred to as device isolation layer. In the present embodiment, the device isolation layer includes a trench device isolation layer formed through a shallow trench isolation (STI) process. The gate pattern 40 includes a gate insulation layer 36 and a gate conductive layer 38. The gate insulation layer 36 may include both an oxide layer and a metal oxide layer having a thin equivalent oxide thickness (EOT) and exhibiting good, i.e., low, current leakage characteristics. The gate conductive layer 38 may comprise one or more layers of polysilicon, one or more metals, metal nitrides, metal silicides or a combination thereof. An insulating spacer (not shown) will typically be formed on the sidewalls of the gate pattern 40 with both lightly-doped (LDD) and heavily doped source/drain regions formed by implanting appropriate impurity atoms into surface portions of the substrate 30 adjacent to the gate pattern 40 and/or the insulating spacers.

A first insulation interlayer 32 is formed on the substrate 30, and a contact pad 34 is formed through the first insulation interlayer 32 in the cell area and the boundary area of the substrate 30. The capacitor 48 includes a cylindrical lower electrode 42, a dielectric layer 44 formed on the lower electrode 42 and an upper electrode 46 formed on the dielectric layer 44. The contact pad 34 is electrically connected to the cylindrical lower electrode 42 of the capacitor 48. In this example embodiment, the lower and upper electrodes 42 and 46 may comprise polysilicon, a metal or a metal silicide, and the dielectric layer 44 may comprise a metal oxide.

Figure 4:
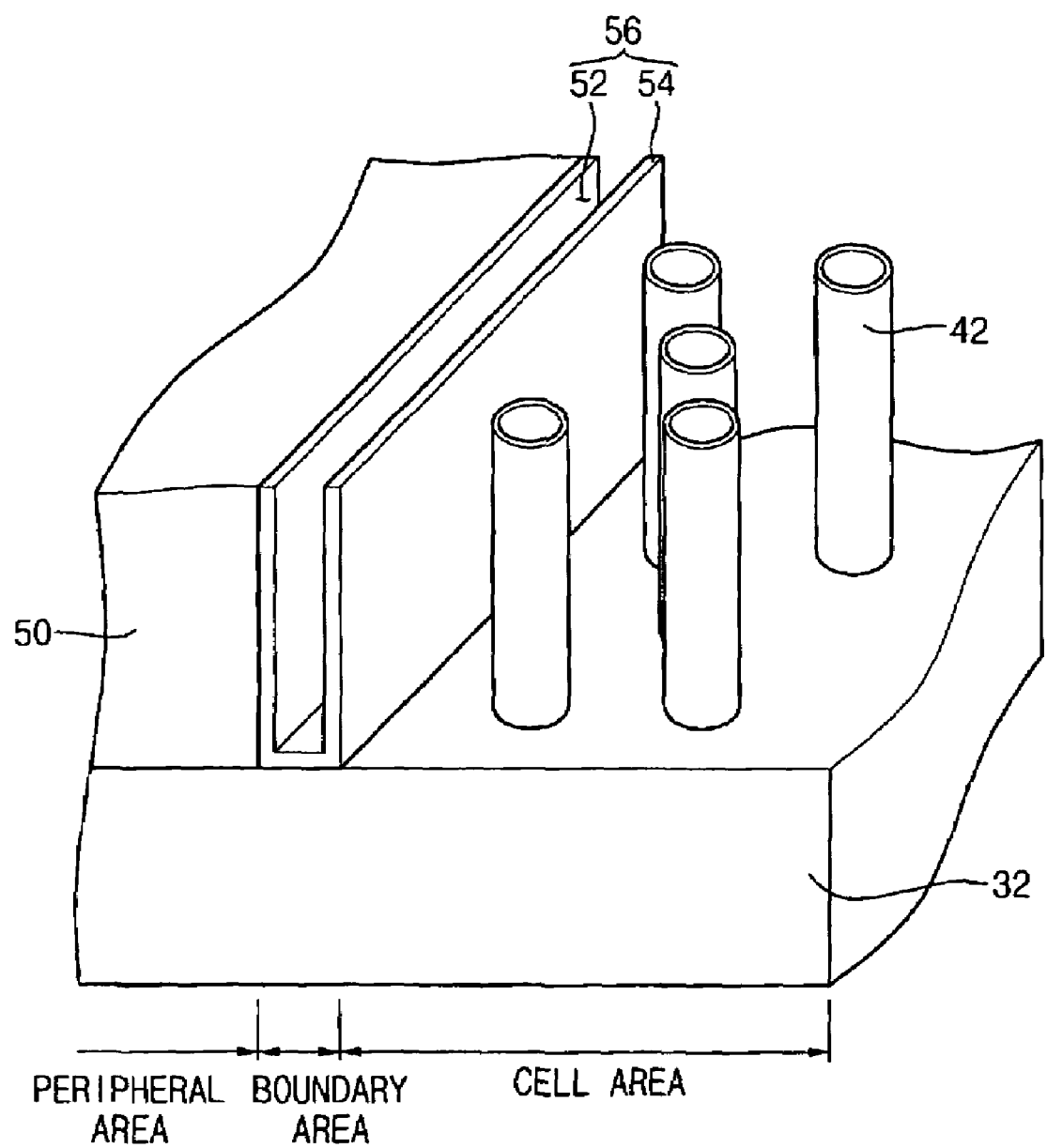
FIG. 4 is a perspective view illustrating a groove of the dummy pattern shown in FIG. 3.

A mold pattern 50 in the peripheral area of the substrate 30 may be a residual mold layer remaining on the substrate 30 from the formation of the lower electrode 42 and may comprise an oxide and/or other insulating materials. As shown in FIG. 4, the dummy pattern 56 in the boundary area of the substrate 30 includes a boundary opening 52 through which a top surface of the first insulation interlayer 32 is exposed and a portion of the thin layer 54 from which the lower electrode 42 is formed extending along the sidewalls of the boundary opening and exposed portion of the top surface of the first insulation interlayer 32, i.e., the bottom surface of the boundary opening 52.

A second insulation interlayer 58 is then formed on a resultant structure including capacitors 48 and the dummy pattern 56. In this example embodiment, the second insulation interlayer 58 will exhibit no step difference between the peripheral area and the cell area of the substrate 30 because the mold pattern 50 remains on the peripheral area of the substrate 30. Because no step difference is produced, no additional processes are required for removing or reducing the step difference between regions of the second insulation interlayer 58 formed over the cell area and the peripheral area.

Figure 5A:
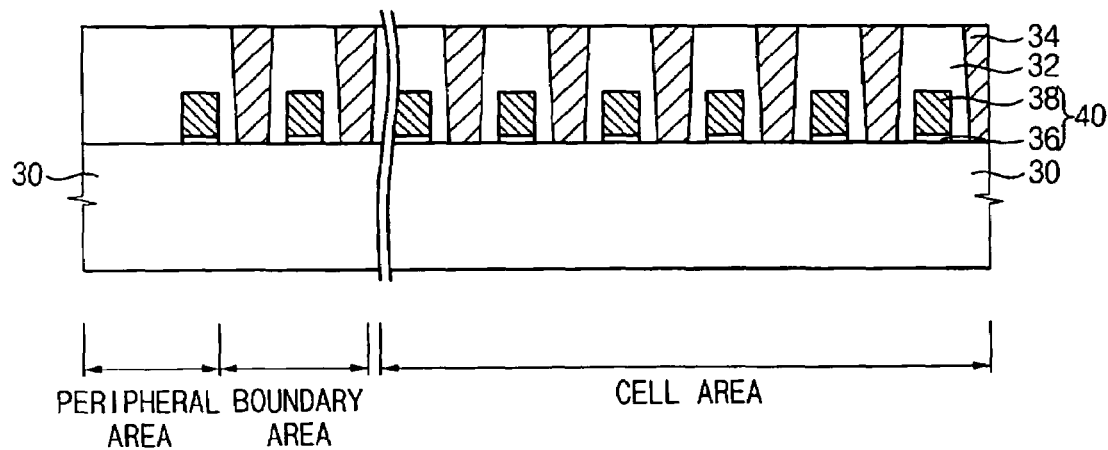
FIGS. 5A to 5H are cross sectional views illustrating processing steps for a method of forming the semiconductor device shown in FIG. 3 according to an example embodiment of the invention.

An example embodiment of a method for manufacturing semiconductor devices having a structure corresponding to that shown in FIG. 3 is illustrated in FIGS. 5A to 5H. As illustrated in FIG. 5A, a semiconductor substrate 30 is provided in such a way that a cell area, a peripheral area and a boundary area separating the cell area and the peripheral area are defined thereon. A trench device isolation pattern (not shown) is formed in the substrate 30 using a device isolation process, for example, a shallow trench isolation (STI) process, to define an active region on which conductive structures are formed and field regions for isolating adjacent active regions from one another.

An insulation layer and a conductive layer are then sequentially formed on the substrate 30. The insulation layer may include a metal oxide layer formed by an atomic layer deposition (ALD) process, and the conductive layer may include a polysilicon layer, a metal layer, a metal nitride layer, a metal silicide layer or a combination thereof formed by a chemical vapor deposition (CVD) process. In particular, the formation of a metal silicide layer further may include the sequential deposition of a polysilicon layer and a refractory metal layer that are subjected to a heat treatment to produce a silicide layer. A hard mask layer comprising nitride may also be formed on the conductive layer. The insulation layer and the conductive layer are then patterned and etched to form a gate pattern 40 on the substrate 30 from the stacked structure of the gate insulation layer 36 and the gate conductive layer 38. An insulating spacer including nitride and/or oxide may be further formed on the sidewalls of the gate pattern 40 to protect the gate pattern and/or provide an implant mask for source/drain implants.

Donor or acceptor impurity atoms may be lightly implanted into surface portions of the substrate 30 adjacent to the gate pattern 40 using the gate pattern 40 as an implantation mask to form LDD regions, followed by heavier impurity implants into at surface portions of the substrate 30 separated from the gate pattern by the insulating spacers.

A first insulation interlayer 32 is then formed on the resultant structure including the gate pattern 40 by a CVD process. The first insulation interlayer 32 may comprise an oxide, and more particularly, comprise an oxide doped with impurities, for example, a borophosphosilicate glass (BPSG), for improving insulation, reflow and/or leakage characteristics. The first insulation interlayer 32 is then patterned and etched to form openings through which portions of the substrate 30 is exposed.

A layer of conductive material, for example, polysilicon, is then deposited to fill the openings between adjacent gate structures of the gate pattern 40, using, for example, a chemical vapor deposition (CVD) process. An upper portion of the layer of conductive material is then removed by, for example, a chemical mechanical polishing (CMP) process to form first plugs and first contact pads 34 that are in electrical contact with the substrate 30 and provide a planarized surface for subsequent processing. Because the first plugs and the first contact pads, i.e., the upper surface of the first plugs, are integrally formed, they are not distinguished from each other in figures.

Figure 5B:
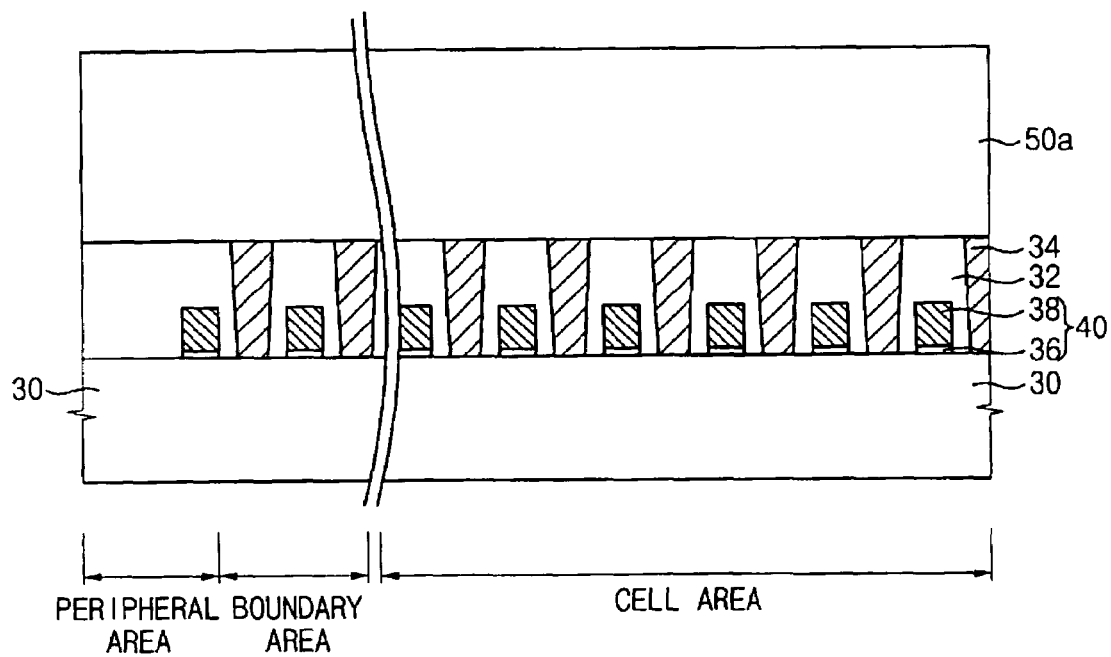

As illustrated in FIG. 5B, an insulating mold layer 50a is then formed on the first insulation interlayer 32 and the contact pads 34. The insulating mold layer 50a may be formed using a CVD process and may comprise one or more layers of oxide or other insulating material.

Figure 5C:
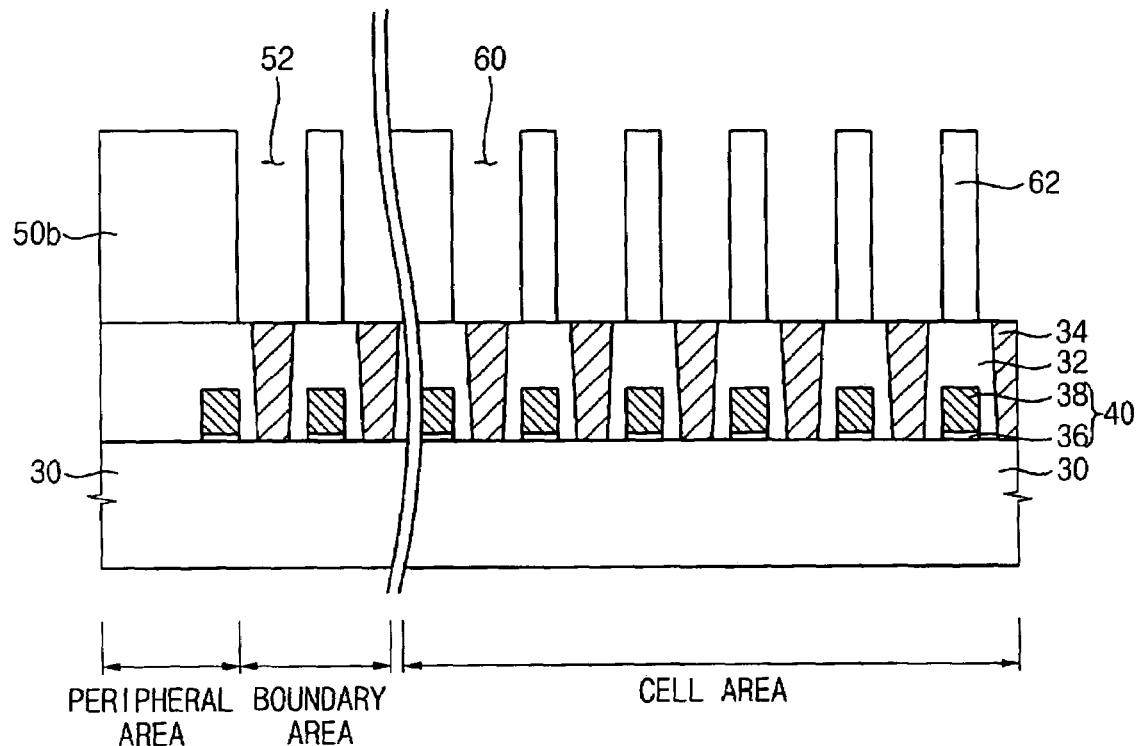
Figure 6:
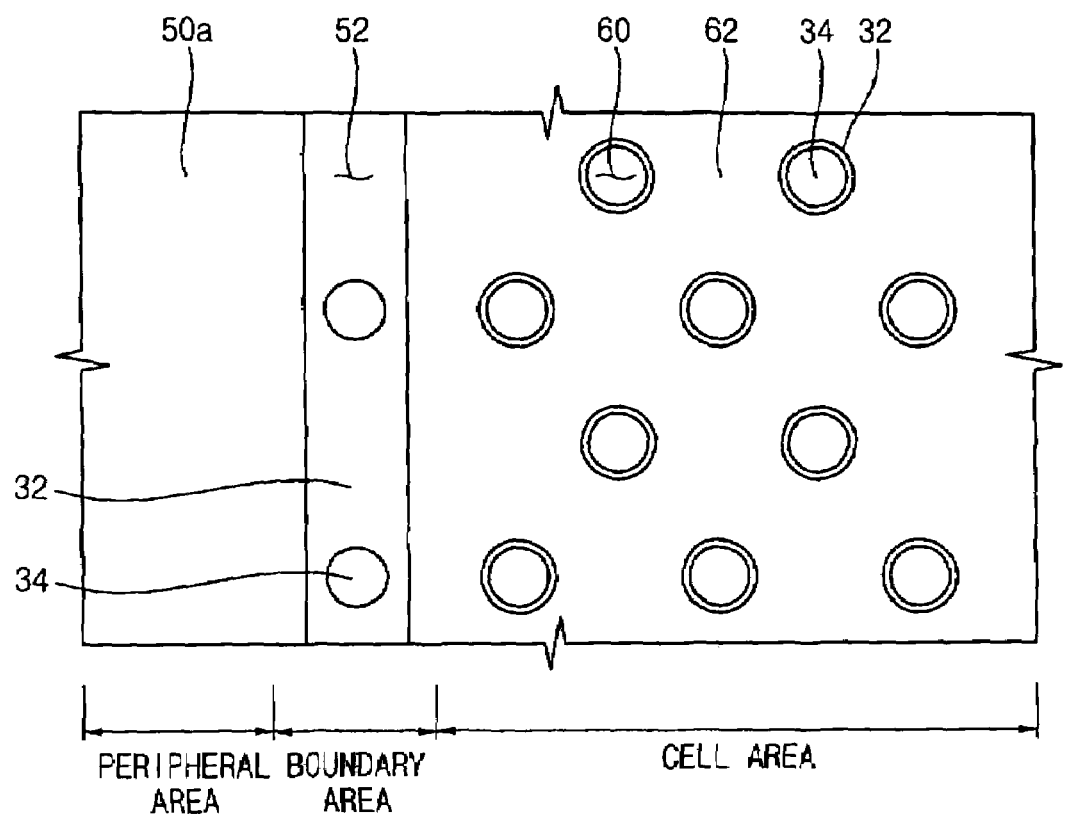
FIG. 6 is a plan view illustrating the structure shown in FIG. 5C produced by a method according to an example embodiment of the invention.

As illustrated in FIG. 5C, the mold layer 50a is patterned and etched to form a first mold pattern 62 in the cell area, an elongated boundary opening 52 in the boundary area and a residual mold layer 50b on the first insulation interlayer 32. As shown in FIG. 6, the first mold pattern 62 may include a plurality of cylindrical holes 60 distributed across the cell area of the substrate 30, and the boundary opening 52 is formed into an elongated, generally linear shape along an edge of the cell area in the boundary area of the substrate 30. Accordingly, individual contact pads 34 and portions of the surface of the first insulation interlayer 32 are exposed in the cylindrical holes 60 formed in the cell area while a plurality of individual contact pads and the portions of the surface of the first insulation interlayer separating the exposed contact pads are exposed by the boundary opening 52 in the boundary area. The first mold pattern 62 and the boundary opening 52 are formed by a photolithography process using a reticle having a pattern corresponding to the cylindrical hole 62 and the boundary opening 52. The mold layer 50a in the peripheral area of the substrate 30 is not removed in the photolithography process and remains on the first insulation interlayer 32 to form the residual mold layer 50b.

Figure 5D:
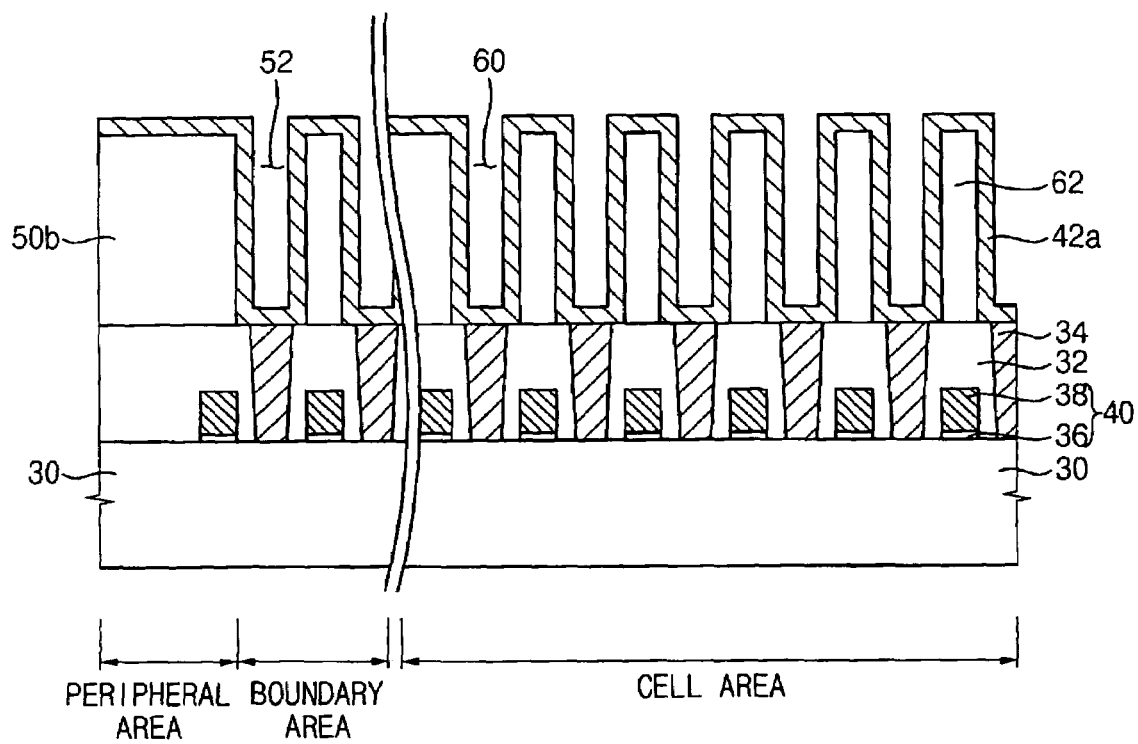

As illustrated in FIG. 5D, a thin layer of conductive material 42a suitable for forming a lower electrode of a capacitor is then formed on resultant structure including the exposed surfaces of first mold pattern 62, the boundary opening 52 and the residual mold layer 50b. The thin layer 42a may be formed by, for example, a CVD, ALD or other process, and will be formed on the inner sidewalls of the cylindrical holes 60, the top surfaces of the first mold pattern 62, the inner sidewalls of the boundary opening 52, the top surface of the residual mold layer 50b and on the exposed regions of the top surface of the first insulation interlayer 32 and the contact pads 34. The thin layer 42a may comprise polysilicon, a metal, a metal nitride or a combination thereof. For this example embodiment, it is expected that a thin layer 42a comprising a combination of a metal or a metal nitride will be suitable for fabricating highly integrated semiconductor devices.

Figure 5E:
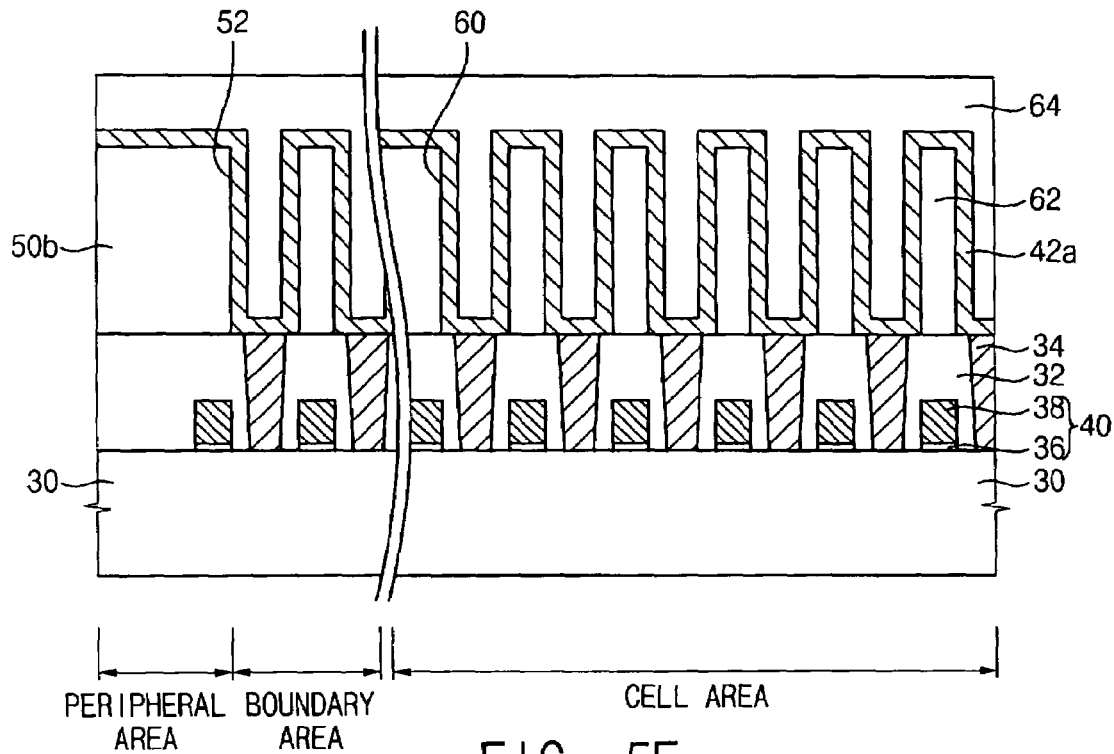
Figure 5F:
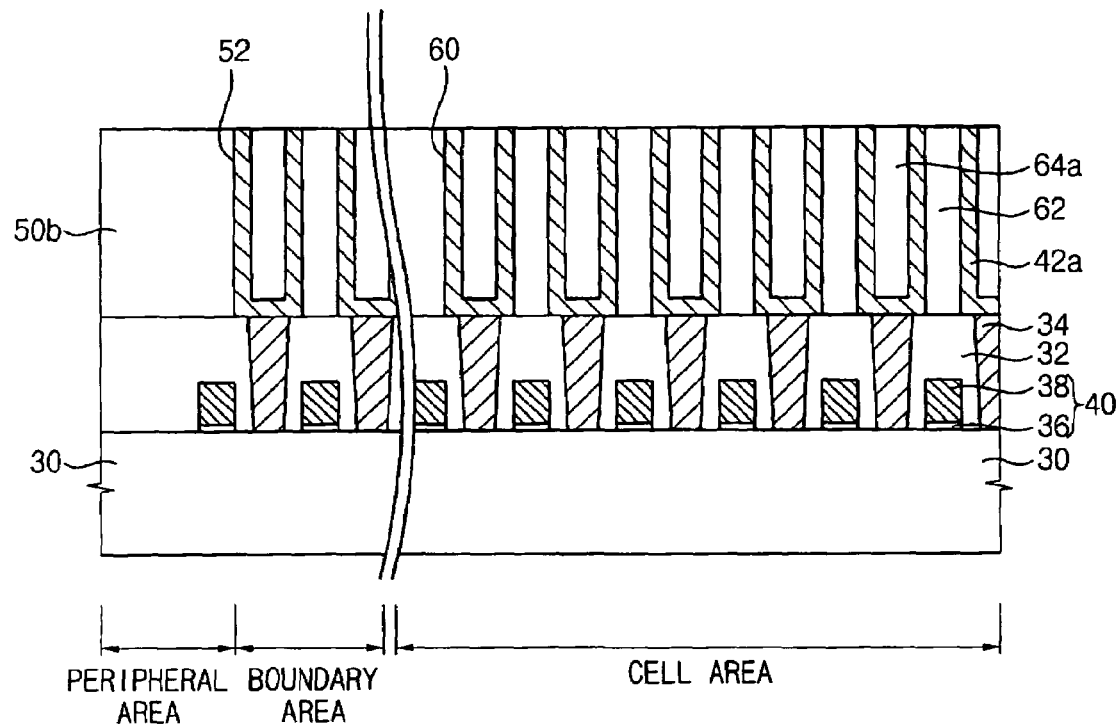

As illustrated in FIG. 5E, a sacrificial layer 64 is formed on the thin layer 42a to a sufficient thickness to fill up the cylindrical hole 60 and the boundary opening 52. The sacrificial layer 64 may have a substantially same etching selectivity as that of the mold layer 50a or as the hard mask pattern described henceforth. In this example embodiment, the sacrificial layer 64 may comprise an oxide formed by a CVD process.

As illustrated in 5F, upper portions of the sacrificial layer 64 and the thin layer 42a are removed by, for example, a CMP process or an etching process, to expose the top surface of the first mold pattern 62 and the residual mold layer 50b and provide node separation. Lower portions of the thin layer 42a will remain on the inner sidewalls of the cylindrical hole 60 and the boundary opening 52 and on the exposed top surface of the first insulation interlayer 32 and the contact pad 34. Hereinafter, the portion of thin layer 42a remaining after the node separation is referred to as node-separated thin layer 42b and will serve as a lower electrode structure. Further, the portion of the sacrificial layer 64 remaining in the cylindrical hole 60 and the boundary opening 52 comprise a residual sacrificial layer 64a.

Figure 5G:
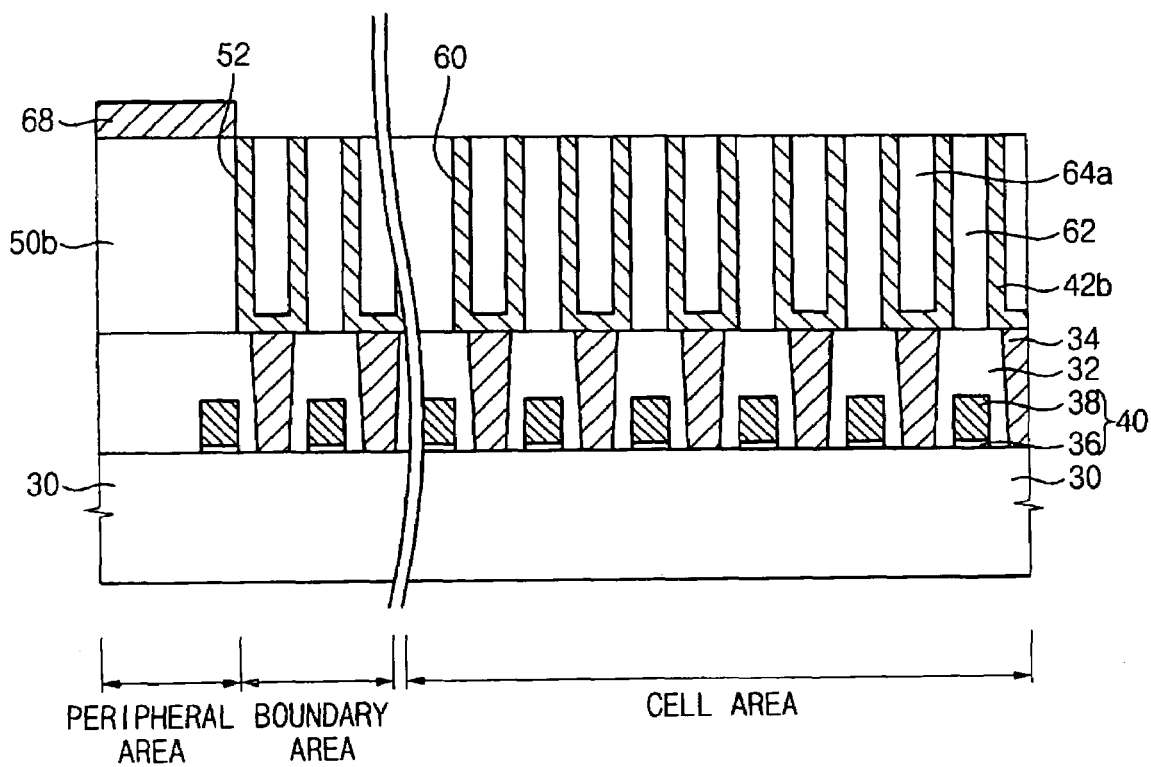

As illustrated in FIG. 5G, a hard mask pattern 68 is then formed on the resultant structure by a combination of forming, patterning and, if required, etching, processes to protect the residual mold layer 50b with the hard mask material while exposing the residual sacrificial layer 64a and the node-separated thin layer 42b. The hard mask pattern 68 material is selected to provide a much lower etch rate than that of the residual sacrificial layer 64a and the first mold pattern 62 and comprise, for example, a photoresist composition, a nitride or other suitably etch-resistant material or combination of materials. Using a photoresist composition to forming the hard mask pattern 68 can reduce complications for subsequent processing and eliminate the need for both a deposition process and an etch process. Accordingly, unless the process requirements warrant the use of a nitride or other "hard" material, a photoresist pattern may provide a suitable hard mask pattern 68.

Accordingly, a photoresist layer or film (not shown) is formed on the node-separated tin layer 42b and the residual sacrificial layer 64a. The photoresist layer is then exposed and developed by a photolithography process to produce the hard mask pattern 68 that exposes the residual sacrificial layer 64a, the node-separated thin layer 42b and the first mold pattern 62 in the boundary area and the cell area of the substrate 30.

Figure 5H:
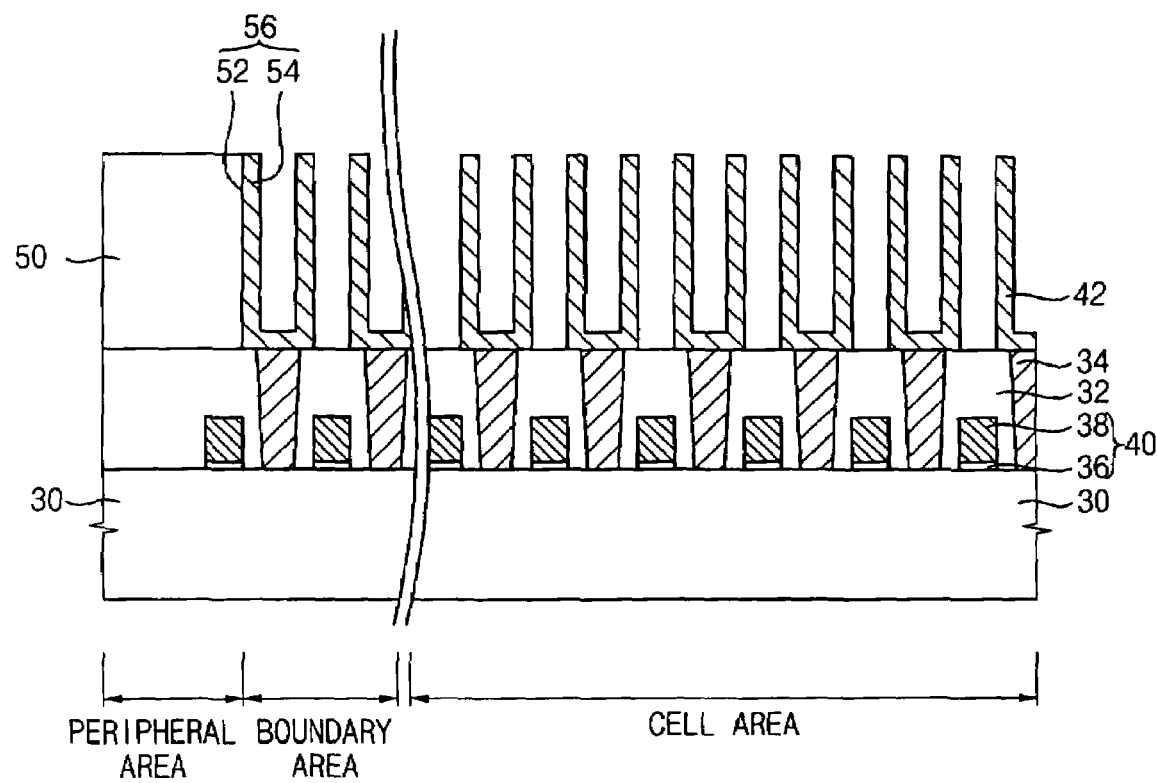

As illustrated in FIG. 5H, the first mold pattern 62 and the residual sacrificial layer 64a are removed from the substrate 30 by using the hard mask pattern 68 as an etch mask. Because the material forming the first mold pattern 62 is selected to have substantially the same etching selectivity as the residual sacrificial layer 64a, the first mold pattern 62 and the residual sacrificial layer 64a are removed substantially simultaneously using a single etch chemistry. For example, the first mold pattern 62 and the residual sacrificial layer 64a may comprise oxide and a wet etching process using a Low Ammonium fluoride Liquid (LAL) solution may be utilized to remove both the first mold pattern and the residual sacrificial layer. The LAL solution is a mixed solution of ammonium fluoride ($NH_4F$), hydrogen fluoride (HF) and water ($H_2O$).

The node-separated thin layer 42b has a lower etch rate than that of the first mold pattern 62 and the residual sacrificial layer 64a, so that the node-separated thin layer 42b remains largely unaffected by the etching process that removes the first mold pattern 62 and the residual sacrificial layer 64a. The node-separated thin layer 42b on a sidewall and a bottom portion of the boundary opening 52 functions as an etching mask during the above etching process in the boundary area of the substrate 30 to protect the residual mold layer 50b.

Accordingly, as shown in FIG. 3, a cylindrical lower electrode 42 is formed in the cell area of the substrate 30, and a second mold pattern 50 largely comprising the residual mold layer 50b is formed on the peripheral area of the substrate 30. The node-separated thin layer 42b remains on the sidewall and the bottom portion of the boundary opening 52, thereby forming a dummy pattern 56 in the boundary area of the substrate 30.

According to the present embodiment, because the lower electrode 42 is formed based on the first mold pattern 62 and the second mold pattern 50 is formed based on the residual mold layer 50b, and the thickness of the layer from which the first mold pattern 62 was formed is substantially the same as the thickness of the layer from which the residual mold layer 50b was formed, the height of the lower electrode 42 will be substantially the same as height of the second mold pattern 50.

Then, as shown in FIG. 3, a dielectric layer 44 and an upper lower electrode 46 are sequentially formed on the resultant structure, which includes the lower electrodes 42, so that substantially no step difference is created between the cell area and the peripheral area of the substrate 30. In particular, the dielectric layer 44 is formed along a surface of the lower electrode 42, of the second mold pattern 50 and of the dummy pattern 56, so that the height of the dielectric layer is the same regardless of whether it is formed in the cell area or the peripheral area of the substrate 30. In the example embodiments, the dielectric layer 44 may comprise a metal oxide for forming highly integrated semiconductor devices and may be formed using an ALD process to provide improved thickness control. The upper electrode 46 will be formed on the dielectric layer 44, typically to a thickness sufficient to fill the spaces remaining between the vertical walls of the lower electrode and between adjacent lower electrodes. Accordingly, the upper surface of the upper electrode 46 will exhibit a substantially uniform height in both the cell area and the peripheral area of the substrate 30. The upper electrode 46 may comprise substantially the same material as the lower electrode 42, so that the upper electrode 46 may be formed as a multilayer structure in which a metal layer and a metal nitride layer are sequentially stacked on each other, as described with reference to FIG. 5D. The upper electrode 46 may be also formed by a CVD process.

With the formation of the upper electrode 46, a capacitor 48 including the lower electrode 42, the dielectric layer 44 and the upper electrode 46 is formed on the substrate 30. Thereafter, as illustrated in FIG. 3, a second insulation interlayer 58 is formed on a resultant structure including the capacitor 48. The second insulation interlayer 58 is formed on the upper electrode 46 to a substantially uniform height in both the cell area and the peripheral area of the substrate 30, so that the second insulation interlayer 58 exhibits no step difference on its top surface. That is, because the second mold pattern 50 provided in the peripheral area of the substrate 30 has substantially the same height as the lower electrode 42 formed in the cell area of the substrate, the second insulation interlayer 58 formed in the peripheral area and the cell area of the substrate will also exhibit a substantially uniform height, i.e., a generally planar surface.

Because the second insulation interlayer 58 exhibits no significant step difference on its upper surface, no additional processing is required to provide a substantially planar surface for subsequent processing. Accordingly, subsequent processing may proceed as desired without incurring processing complications or producing unwanted defects while omitting the additional processing associated with removing or reducing the step difference.

Although the example embodiment of the invention detailed above utilizes a sacrificial layer 64a having substantially the same etching characteristics as the mold pattern 62, those skilled in the art will appreciate that the semiconductor device may also be manufactured under conditions whereby the sacrificial layer has substantially the same etching characteristics as the hard mask pattern, as described in more detail below. Similarly, other example embodiments of the invention may utilize sacrificial layers 64a having etching characteristics that are substantially different that those of the mold pattern 62 and may utilize a combination of etch chemistries and techniques to remove the respective structures.

FIGS. 7A to 7D are cross sectional views illustrating processing steps for another example embodiment of a method for manufacturing semiconductor devices according to the invention and as shown in FIG. 3. In FIGS. 7A to 7D, the same reference numbers will be used to refer to the same or similar parts and/or elements as those shown in the previous drawings of FIGS. 5A to 5H with the exception of the sacrificial layer and the hard mask pattern.

Utilizing a process the same or similar to that described with reference to FIGS. 5A to 5D, a thin layer 42a for a lower electrode of a capacitor is continuously formed along a surface of the first mold pattern 62 by a CVD process. The thin layer 42a will be formed on sidewalls and top surfaces of the cylindrical hole 60, the boundary opening 52 and the residual mold layer 50b and on the exposed top surface of the first insulation interlayer 32 and the contact pad 34. The thin layer 42a may comprise polysilicon, a metal, a metal nitride or a combination thereof. In this example embodiment, the thin layer 42a may comprise a combination of a metal and a metal nitride in order to achieve a satisfactory degree of integration in the resulting semiconductor devices.

Figure 7A:
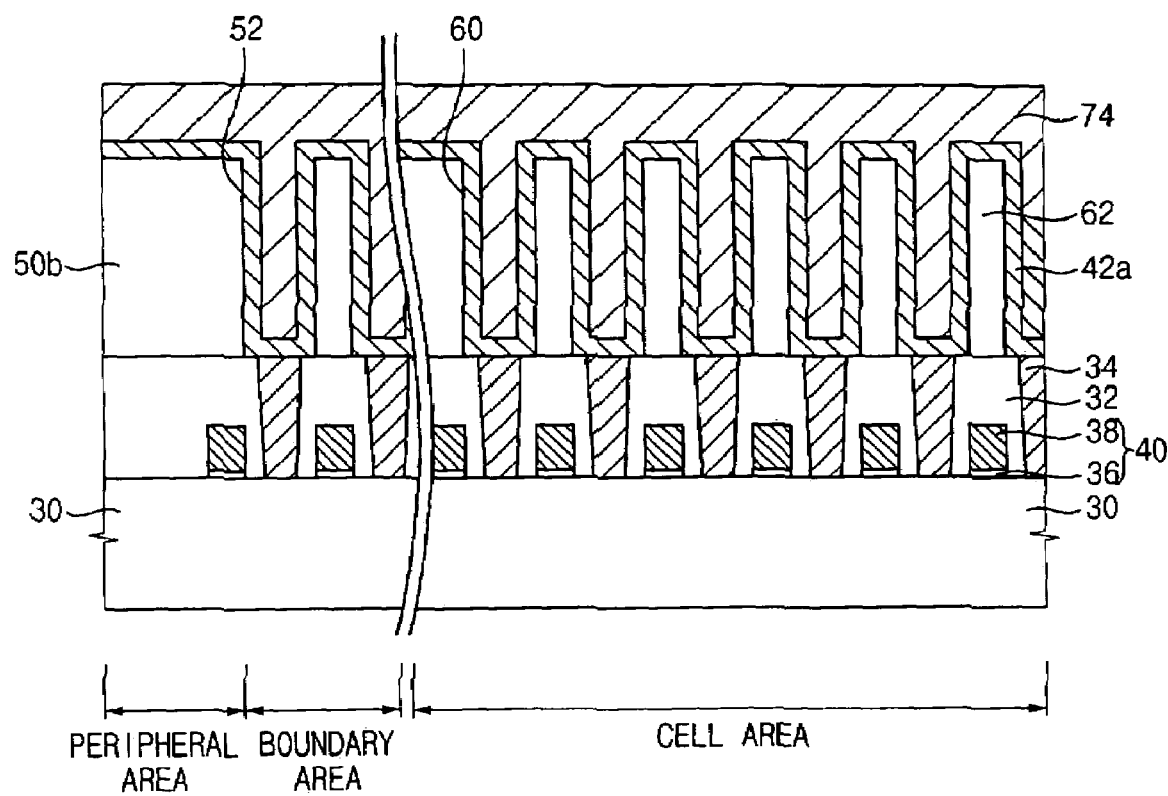
FIGS. 7A to 7D are cross sectional views illustrating processing steps for a modified method of manufacturing the semiconductor device shown in FIG. 3 according to another example embodiment of the invention.

As illustrated in FIG. 7A, a sacrificial layer 74 is formed on a resultant structure including the thin layer 42a to a sufficient thickness to fill up the cylindrical hole 60 and the boundary opening 52.

Figure 7B:
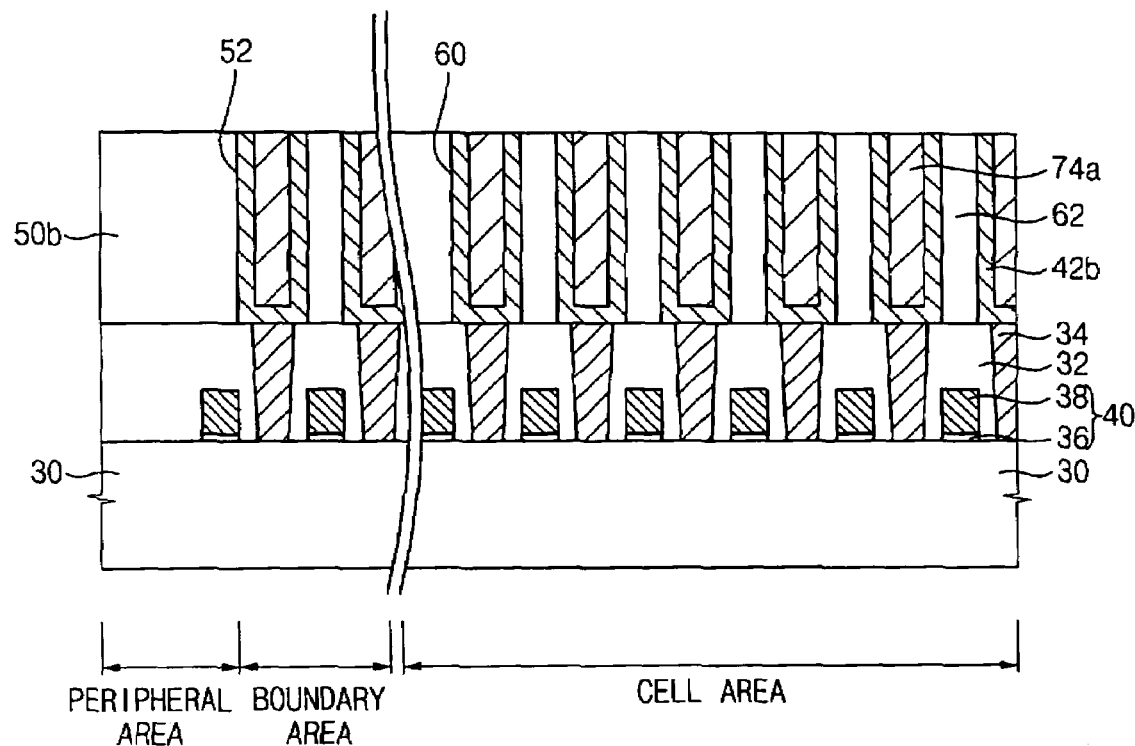

The sacrificial layer 74 may comprise a photoresist composition that exhibits substantially the same etching rate as the hard mask pattern 78 described below. As illustrated in FIG. 7B, the upper portions of the sacrificial layer 74 and the thin layer 42a are removed to expose a top surface of the first mold pattern 62 by using, for example, a CMP process or an etching process. A lower portion of the thin layer 42a will remain on sidewalls of the cylindrical holes 60 and the boundary opening 52 and on the exposed top surface of the first insulation interlayer 32 and the contact pad 34, thereby achieving node separation of the lower electrodes. Hereinafter, the thin layer 42a remaining after the node separation is referred to as node-separated thin layer 42b. Further, the sacrificial layer 74 also remains in the cylindrical hole 60 and the boundary opening 52, thereby forming a residual sacrificial layer 74a.

Figure 7C:
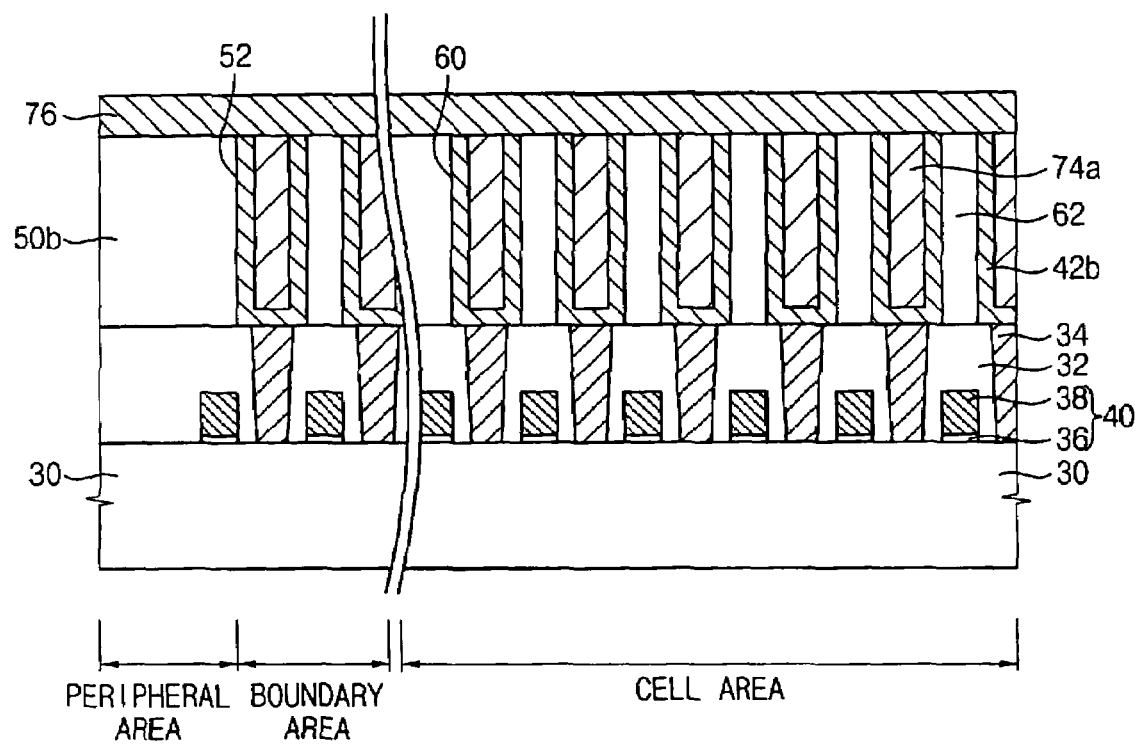
Figure 7D:
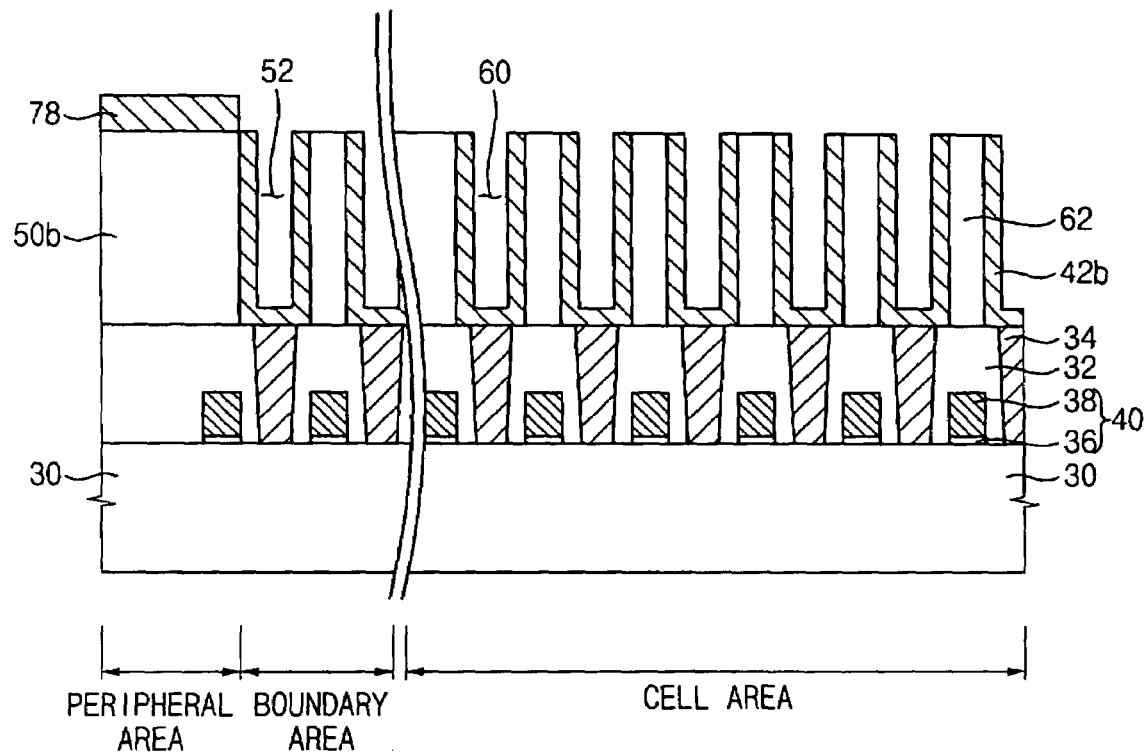

As illustrated in FIGS. 7C and 7D, a photoresist film 76 is formed on a resultant structure including the node-separated thin layer 42b and the residual sacrificial layer 74a, and is patterned and developed or otherwise partially removed using a photolithography process to form a hard mask 78. Hard mask 78 is configured whereby the cell area and the boundary area of the substrate 30 are exposed while the residual mold layer 50b in the peripheral area of the substrate 30 remains protected by the hard mask pattern 78. The hard mask pattern 78 exposes the residual sacrificial layer 74a, the node-separated thin layer 42b and the first mold pattern 62 in the boundary and cell areas of the substrate 30. The residual sacrificial layer 74a in the cylindrical hole 60 and the boundary opening 52 may then be removed simultaneously with the photoresist film in the cell area and the boundary area of the substrate 30 in the developing/etching process used to form the hard mask pattern 78.

Accordingly, the hard mask pattern 78 is formed on the residual mold layer 50b, and the node-separated thin layer 42b remains on sidewalls of the cylindrical hole 60 and the boundary opening 52 and on the exposed first insulation interlayer 32 and the contact plug 34, as shown in FIG. 7D.

Then, the first mold pattern 62 is removed from the substrate 30 by an etching process using the hard mask pattern 78 as an etching mask. If the first mold pattern 62 comprises an oxide, a wet etching process using a Low Ammonium fluoride Liquid (LAL) solution may be utilized to remove the first mold pattern 62. The node-separated thin layer 42b has a lower etching rate than that both the first mold pattern 62 and the residual sacrificial layer 64a so that the node-separated thin layer 42b will remain largely unaffected by the etching process(es) used to remove the first mold pattern 62 and the residual sacrificial layer 64a and will, accordingly, substantially maintain its pre-etch configuration. The node-separated thin layer 42b on a sidewall and a bottom portion of the boundary opening 52 functions as an etching mask during the above etching process in the boundary area of the substrate 30.

Accordingly, as shown in FIG. 3, a cylindrical lower electrode 42 is formed in the cell area of the substrate 30, and a second mold pattern 50 including the residual mold layer 50b is formed on the peripheral area of the substrate 30. The node-separated thin layer 42b remains on the sidewall and the bottom portion of the boundary opening 52, thereby forming a dummy pattern 56 in the boundary area of the substrate 30.

Particularly, because the lower electrode 42 is formed on the first mold pattern 62 and the second mold pattern 50 is formed on the residual mold layer 50b, the height of the first mold pattern 62 will be substantially the same as that of the residual mold layer 50b, the height of the lower electrode 42 will be substantially the same as the second mold pattern 50.

Then, as shown in FIG. 3, a dielectric layer 44 and an upper lower electrode 46 are sequentially formed on a resultant structure including the lower electrode 42 to form capacitors in the cell area and without creating a substantial step difference between the cell area and the peripheral area of the substrate 30. In particular, because the dielectric layer 44 is formed along the exposed surfaces of the lower electrode 42, the second mold pattern 50 and the dummy pattern 56, the height of the dielectric layer will be substantially the same in both the cell area and the peripheral area of the substrate 30.

The upper electrode 46 is typically formed on the dielectric layer 44 to a thickness sufficient to fill the spaces remaining in the interior of the lower electrode 42 and between adjacent lower electrodes. Accordingly, the upper surface of the upper electrode 46 will exhibit a substantially uniform height in both the cell area and the peripheral area of the substrate 30. As a result, a capacitor 48 including the lower electrode 42, the dielectric layer 44 and the upper electrode 46 is formed on the substrate 30.

Thereafter, a second insulation interlayer 58 in FIG. 3 is formed on a resultant structure including the capacitor 48.

The second insulation interlayer 58 is formed on the upper electrode 46 to a uniform height regardless of the cell area and the peripheral area of the substrate 30, so that the second insulation interlayer 58 exhibits little or no step difference at a top portion thereof. That is, by forming the second mold pattern 50 having the same height as that of the lower electrode 42 in the peripheral area of the substrate 30, the subsequently deposited layers will exhibit a substantially planar surface across both the peripheral area and the cell area of the substrate 30.

Accordingly, the second insulation interlayer 58 will exhibit little or no step difference across its upper surface and, accordingly, no additional processing is required for removing the step difference of the second insulation interlayer 58 before subsequent processing is performed. In this manner, subsequent processes may be performed satisfactorily without subjecting the substrate to additional processing or increasing the number of defects despite of omitting the additional processes traditionally required for reducing the step difference between cell areas and peripheral areas of the substrate 30.

A semiconductor devices according to the invention may also be manufactured using another example embodiment of a method wherein the sacrificial layer is selected so as to provide substantially the same etch rate as that of the hard mask pattern in a single etch process, as described hereinafter.

Figure 8:
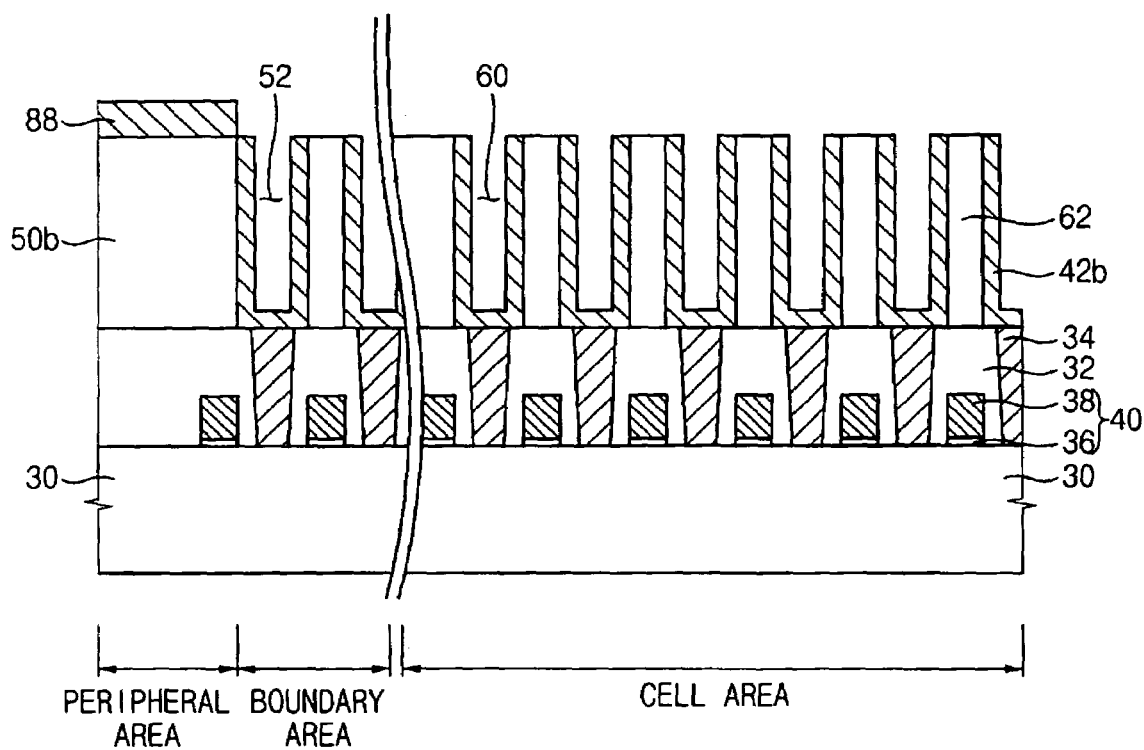
FIG. 8 is a cross sectional view illustrating a processing step for another modified method of manufacturing the semiconductor device shown in FIG. 3 according to another example embodiment of the invention.

FIG. 8 is a cross sectional view illustrating a processing step for another example embodiment of methods of manufacturing semiconductor devices generally corresponding to the structure illustrated in FIG. 3. In FIG. 8, the same reference numbers will be used to refer to the same or similar elements and/or structures as those shown in the previous drawings of FIGS. 7A to 7D with the exception of the hard mask pattern.

Utilizing an example embodiment of a process corresponding to that described above with reference to FIGS. 7A to 7B, the upper portions of the sacrificial layer 74 and the thin layer 42a are removed to expose a top surface of the first mold pattern 62 and form a generally planar surface, typically utilizing a CMP process or an etching process. The lower portion of the thin layer 42a will remain on sidewalls of the cylindrical hole 60, the boundary opening 52, the exposed top surface of the first insulation interlayer 32 and the contact pad 34, thereby completing a node separation and forming a plurality of lower electrodes. Hereinafter, the thin layer 42a remaining after the node separation is referred to as node-separated thin layer 42b. Further, the lower portion of the sacrificial layer 74 also remains in the cylindrical hole 60 and the boundary opening 52, thereby forming a residual sacrificial layer 74a.

The residual sacrificial layer 74a may then removed from the substrate 30 by an etching process. In this example embodiment, the first mold pattern 62 and the node-separated thin layer 42b are selected to provide etching rates much lower than that of the residual sacrificial layer 74a. Accordingly, the residual sacrificial layer 74a may be selectively removed from the substrate 30, while the first mold pattern 62 and the node-separated thin layer 42b remain on the substrate 30.

A photoresist film (not shown) that provides an etching rate lower than that of the first mold pattern 62 is then formed on a resultant structure in which the residual sacrificial layer 74a has been removed from the substrate 30. That is, a photoresist film is formed on the residual mold layer 50b with sufficient thickness or under conditions suitable to fill the cylindrical hole 60 and the boundary opening 52 from which the residual sacrificial layer 74a was previously removed.

The photoresist film may then be exposed and developed, etched or otherwise selectively removed by a photolithography process in such a way that the photoresist film in the cell area and the boundary area of the substrate 30 is removed while the photoresist layer in the peripheral area of the substrate 30 remains on the residual mold layer 50b. This hard mask pattern 88 exposes the node-separated thin layer 42b and the first mold pattern 62 in the boundary area and the cell area of the substrate 30. Accordingly, the hard mask pattern 88 is formed on the residual mold layer 50b, and the node-separated thin layer 42b remains on sidewalls of the cylindrical hole 60 and the boundary opening 52 and on the exposed first insulation interlayer 32 and the contact plug 34, as shown in FIG. 8.

The first mold pattern 62 is then removed from the substrate 30 using an appropriate etching process and by using the hard mask pattern 88 as an etching mask. When the first mold pattern 62 comprises oxide, a wet etching process using a Low Ammonium fluoride Liquid (LAL) solution may be performed to provide adequate removal of the first mold pattern 62. The node-separated thin layer 42b has a lower etch rate than either the first mold pattern 62 or the residual sacrificial layer 64a, so that the node-separated thin layer 42b remains largely unaffected during the removal of the first mold pattern 62 and the residual sacrificial layer 64a. The node-separated thin layer 42b on a sidewall and a bottom portion of the boundary opening 52 also functions as an etching mask during the removal of the first mold pattern 62 and the residual sacrificial layer 64a to protect the residual mold layer 50b and avoid undercutting of the hard mask 88 in the peripheral area.

Accordingly, as shown in FIG. 3, cylindrical lower electrodes 42 are formed in the cell area of the substrate 30, and a second mold pattern 50 including the residual mold layer 50b is formed on the peripheral area of the substrate 30. The node-separated thin layer 42b remains on the sidewall and the bottom portion of the boundary opening 52, thereby forming a dummy pattern 56 in the boundary area of the substrate 30.

In particular, the lower electrode 42 is formed on the first mold pattern 62, and the second mold pattern 50 is formed on the residual mold layer 50b. Because the height of the first mold pattern 62 is substantially the same as the height of the residual mold layer 50b, the height of the lower electrodes 42 formed in the first mold pattern will be substantially the same as the second mold pattern 50. Then, as shown in FIG. 3, a dielectric layer 44 and an upper lower electrode 46 may be sequentially formed on the resultant structure including the lower electrode 42, without creating a step difference between the cell area and the peripheral area of the substrate 30.

The dielectric layer 44 is formed along a surface of the lower electrode 42, of the second mold pattern 50 and of the dummy pattern 56, so that a height of the dielectric layer is substantially the same in both the cell area and the peripheral area of the substrate 30. The upper electrode 46 is typically formed on the dielectric layer 44 with a thickness sufficient to fill the remaining spaces in the lower electrodes 42 and the spaces between adjacent lower electrodes 42. Accordingly, the upper electrode 46 will exhibit a generally uniform height in both the cell area and the peripheral area of the substrate 30 as the capacitor 48 is completed on the substrate 30.

Thereafter, a second insulation interlayer 58 as illustrated in FIG. 3 is formed on a resultant structure including the capacitor 48. The second insulation interlayer 58 is formed on the upper electrode 46, which, as noted above, is formed to a generally uniform height, and will, therefore, have a generally uniform height in both the cell area and the peripheral area of the substrate 30 and will not exhibit a step difference on the top surface. Because the second insulation interlayer 58 will have a substantially planar upper surface, no additional processing will be required to form a planar surface suitable for subsequent processing. Accordingly, a simplified process is provided in which additional planarization steps may be omitted without compromising subsequent processing or introducing additional defects that could result from a surface exhibiting a significant step difference.

According to the invention, a mold pattern 50 is formed in a peripheral area of a substrate 30 and has a height that is substantially the same as lower electrodes 42 formed in the cell area of the substrate so that subsequent thin layers formed on the capacitor and the mold pattern exhibit substantially no step difference. Accordingly, no additional processing is required to reduce or removing such a step difference between the cell area and the peripheral area of the thin layer(s), thereby reducing manufacturing time and expense while providing improved yield and reliability for the final semiconductor device.

Although certain example embodiments of the invention have been described, it is understood that the invention is not limited to these exemplary embodiments and that various changes and modifications can be made by one skilled in the art without departing from the spirit and scope of the invention as disclosed and claimed.

What is claimed is:

1. A method of manufacturing a semiconductor device, comprising:
    forming a mold layer on a substrate on which a cell area, a peripheral area and a boundary area separating the cell area and the peripheral area are defined;
    etching the mold layer to form a first mold pattern including electrode openings in the cell area that expose regions of the substrate, a boundary opening in the boundary area that exposes an extended region of the substrate adjacent the peripheral area and a residual mold layer remaining in the peripheral area;
    forming a layer of a first conductive material on inner sidewalls of the electrode openings and on an extended inner sidewall of the boundary opening;
    forming a sacrificial layer on the first conductive material;
    removing an upper portion of the sacrificial layer and an upper portion the first conductive material to expose a top surface of the first mold pattern and a top surface of the residual mold layer and to isolate portions of the first conductive material in the electrode openings and the boundary opening;
    forming a hard mask pattern that covers the residual mold layer and exposes residual portions of the sacrificial layer formed in the boundary area and the cell area and the first mold pattern formed in the boundary area and the cell area;
    removing the residual portions of the sacrificial layer formed in the boundary area and the cell area and the first mold pattern formed in the boundary area and the cell area using the hard mask pattern as an etch mask, thereby exposing the first conductive material and forming lower electrodes in the electrode holes and a dummy pattern in the boundary opening;
    removing the hard mask pattern to expose the residual mold layer and form a second mold pattern; and
    sequentially forming a dielectric layer and an upper electrode on the lower electrodes and the second mold pattern.

2. The method of manufacturing a semiconductor device according to claim 1, wherein:
    the mold layer comprises a silicon oxide; and
    the first conductive material is selected from a group consisting of polysilicon, metals, metal silicides, metal nitrides and combinations thereof.

3. The method of manufacturing a semiconductor device according to claim 1, wherein:
    the sacrificial layer has a first etch rate in an etch composition; and
    the mold layer has a second etch rate in the etch composition, wherein the first etch rate and the second etch rate are substantially the same.

4. The method of manufacturing a semiconductor device according to claim 3, wherein:
    the first etch rate and the second etch rate vary by less than 25%.

5. The method of manufacturing a semiconductor device according to claim 3, wherein:
    the sacrificial layer is a silicon oxide; and further wherein
    removing the residual portions of the sacrificial layer and the first mold pattern includes exposing the sacrificial layer and the first mold pattern to an aqueous Low Ammonium fluoride Liquid (LAL) solution.

6. The method of manufacturing a semiconductor device according to claim 1, wherein:
    the sacrificial layer has a first removal rate in a removal composition; and
    the hard mask pattern has a second removal rate in the removal composition, wherein the first removal rate and the second removal rate are substantially the same.

7. The method of manufacturing a semiconductor device according to claim 3, wherein:
    the first removal rate and the second removal rate vary by less than 25%.

8. The method of manufacturing a semiconductor device according to claim 6, wherein:
    the sacrificial layer comprises a photoresist composition; and further wherein forming the hard mask pattern includes:
    forming a photoresist film on exposed surfaces of the residual mold layer, the isolated regions of the first conductive material and the residual portions of the sacrificial layer; and
    removing the photoresist film and the residual portions of the sacrificial layer from the cell area with a single removal composition, and
    removing the first mold pattern by exposing the first mold pattern to an aqueous Low Ammonium fluoride Liquid (LAL) solution.

9. The method of manufacturing a semiconductor device according to claim 1, wherein:
    removing the upper portion of the sacrificial layer and the upper portion the first conductive material utilizes a process selected from a group consisting of chemical mechanical polishing (CMP) processes and etch processes.

10. The method of manufacturing a semiconductor device according to claim 1, wherein:
    the second mold pattern has a first height $H_M$; and
    the lower electrodes have a second height $H_E$, wherein the first height and the second height are substantially the same.

11. A method of forming a semiconductor device, comprising:
- forming a mold layer on a semiconductor substrate on which a cell area, a peripheral area and a boundary area separating the cell area and the peripheral area are defined;
- removing regions of the mold layer to form a first mold pattern including electrode openings in the cell area that expose portions of substrate, an elongated boundary opening that exposes an elongated portion of the substrate in the boundary area and a residual mold layer in the peripheral area;
- forming a layer of a first conductive material on inner sidewalls of the electrode openings and on an extended inner sidewall of the boundary opening;
- forming a sacrificial layer on the first conductive material;
- removing an upper portion of the sacrificial layer and an upper portion the first conductive material to expose a top surface of the first mold pattern and a top surface of the residual mold layer and to isolate portions of the first conductive material in the electrode openings and the boundary opening;
- forming a hard mask pattern that covers the residual mold layer and exposes residual portions of the sacrificial layer formed in the boundary area and the cell area and the first mold pattern formed in the boundary area and the cell area;
- removing the residual portions of the sacrificial layer formed in the boundary area and the cell area and the first mold pattern formed in the boundary area and the cell area using the hard mask pattern as an etch mask, thereby exposing the first conductive material and forming lower electrodes in the electrode holes and a dummy pattern in the boundary opening;
- removing the hard mask pattern to expose the residual mold layer and form a second mold pattern; and
- sequentially forming a dielectric layer and an upper electrode on the lower electrodes and the second mold pattern.

12. The method of forming a semiconductor device according to claim 11, wherein:
- the mold layer comprises a silicon oxide; and
- the first conductive material is selected from a group consisting of polysilicon, metals, metal silicides, metal nitrides and combinations thereof.

13. The method of forming a semiconductor device according to claim 11, wherein:
- the sacrificial layer is formed from a first photoresist composition; and
- the hard mask pattern is formed from a second photoresist composition.

14. The method of forming a semiconductor device according to claim 13, wherein:
- removing the first mold pattern includes exposing the first mold pattern to an aqueous Low Ammonium fluoride Liquid (LAL) solution.

15. The method of forming a semiconductor device according to claim 11, wherein:
- removing the upper portion of the sacrificial layer and the upper portion the first conductive material utilizes a process selected from a group consisting of chemical mechanical polishing (CMP) processes and etch processes.

16. The method of forming a semiconductor device according to claim 11, wherein:
- the second mold pattern has a first height $H_M$; and
- the lower electrodes have a second height $H_E$, wherein the first height and the second height are substantially the same.

17. The method of forming a semiconductor device according to claim 16, wherein:
- the first height and the second height vary by less than 200 Å.

* * * * *